United States Patent [19]
Wildner

[11] Patent Number: 6,134,777
[45] Date of Patent: Oct. 24, 2000

[54] BONDING METHOD

[75] Inventor: Ingolf Wildner, Reutlingen, Germany

[73] Assignee: Robert Bosch GmbH, Stuttgart, Germany

[21] Appl. No.: 09/353,220

[22] Filed: Jul. 14, 1999

[30] Foreign Application Priority Data

Jul. 14, 1998 [DE] Germany .......................... 198 31 550

[51] Int. Cl.[7] ................................................ H05K 13/00
[52] U.S. Cl. ................................ 29/854; 29/842; 29/843
[58] Field of Search ........................... 29/825, 826, 846, 29/854; 228/4.5

[56] References Cited

U.S. PATENT DOCUMENTS 3,623,649  11/1971  Keiling .
3,641,660  2/1972   Adams .
3,689,983  9/1972   Eltzroth .
3,812,581  5/1974   Larson .

OTHER PUBLICATIONS

IBM Tech Disc Bull vol. 13, No 6, Nov. 1970, p. 1624, by K. C. Joshi et al.

*Primary Examiner*—Carl J. Arbes
*Attorney, Agent, or Firm*—Kenyon & Kenyon

[57] ABSTRACT

A method for producing wire connections that makes possible the production of retaining bonds. The method involves a calculation of the arrangement of the retaining bonds as a function of the current actual position of the wire connections that are respectively to be equipped with preferably one retaining bond.

4 Claims, 2 Drawing Sheets

BONDING METHOD

FIELD OF THE INVENTION

The present invention relates to a method for producing wire connections.

BACKGROUND INFORMATION

German Patent Application No. 198 23 623.9 describes ball-and-wedge bonding methods in which additional retaining bonds are provided. The retaining bonds reinforce the wedge contacting of the wire connections, and either they themselves constitute a further wire connection between the wedge position that is to be reinforced (which represents the ball position for the retaining bond) and a further wedge position, or alternatively, in a special embodiment, the retaining bonds are attached only on the wedge position of the wire connection. The position of retaining bonds was hitherto defined by indicating ball and wedge positions, analogously to the indication of the ball and wedge positions of the actual wire connections. Retaining bonds are thus treated like wire connections, i.e. the position values of the wire connections of the retaining bonds are stored sequentially without differentiation, for example in an electronic memory. This method proves inflexible if the number of retaining bonds required changes from one manufacturing lot to another, since because of the lack of information about the assignment of retaining bonds to the respective wire connection for each lot, a complete program with all position data must be stored.

SUMMARY OF THE INVENTION

The method according to the present invention for producing wire connections has, in contrast, the advantage of representing a flexible production method in which different embodiments (type and number) of retaining bonds can be selectably retrieved by activating or deactivating assignments of retaining bonds to wire connections. The provision of retaining bonds can be selectively activated or deactivated, completely or partially, by pressing a button within the menu of a software program that controls a bonding apparatus. This results in a shorter retooling time when changing to a manufacturing lot with different requirements in terms of the wire connections to be made between the component carrier and the components located thereon. The assignment of retaining bonds to the wire connections is advantageously accomplished, in this context, by assigning a spacing value that characterizes the retaining bond in terms of its configuration and physical location. Since the assignment of spacing values causes the wire connection and assigned retaining bond to be treated as a unit. The overall result is increased assurance of correct production of the wire connections, since there is a lower probability that a retaining bond will be "forgotten," for example in the event of a program termination and subsequent continuation of the method. It is further to be regarded as advantageous that automatic adjustment of the alignment of the retaining bonds is accomplished based on the relative position of the component and component carrier (e.g. circuit board). This dynamic position adjustment is advantageously accomplished by calculating the current coordinates of the retaining bond as a function of the actual positions of the component and of the contacting surface on the circuit board, and as a function of the spacing value that was entered. The retaining bond is thereby aligned in accordance with the current orientation of the previously produced ball-and-wedge wire connection. As a result, the retaining bonds also become reproducible, and always exhibit the same quality regardless of manufacturing tolerances in the IC placement positions on the component carrier. Special embodiments of retaining bonds, representing a ball-and-wedge combination without a loop between them, are also possible in simple and reproducible fashion. Especially with retaining bonds of this kind whose ball and wedge positions are both located within the wedge region of the wire connection, exact orientation of the retaining bond relative to the alignment of the wire connection is essential for a high-quality wire connection.

It proves particularly advantageous to assign a selectable set of production parameters to each pair of end positions of a wire connection. Production parameters optimized individually for the component or contacting surface can thereby be used. In particular, different production parameters can be provided for the wire connection and for the retaining bond assigned to it. In particular, the ball size can be made larger for the retaining bond than for the actual wire connection; in addition, the retaining bond can be produced more quickly, by applying temperature and ultrasound for a shorter period than in the case of the wire connection. The production parameters in this context are, for example, the force exerted, the time period during which the force acts, and the ultrasound output, temperature, and the aforesaid free-air ball diameter. This results in a time savings of 40% and more, as compared to the use of identical production parameters, in the production of wire connections equipped with retaining bonds.

The combination of pairs of end positions of wire connections into groups allows production parameters to be assigned in grouped fashion, since in general, identical production parameters for the respective wire connections (with or without retaining bonds) are used for any defined pairing of component and contacting surface.

DETAILED DESCRIPTION

Figure 1:
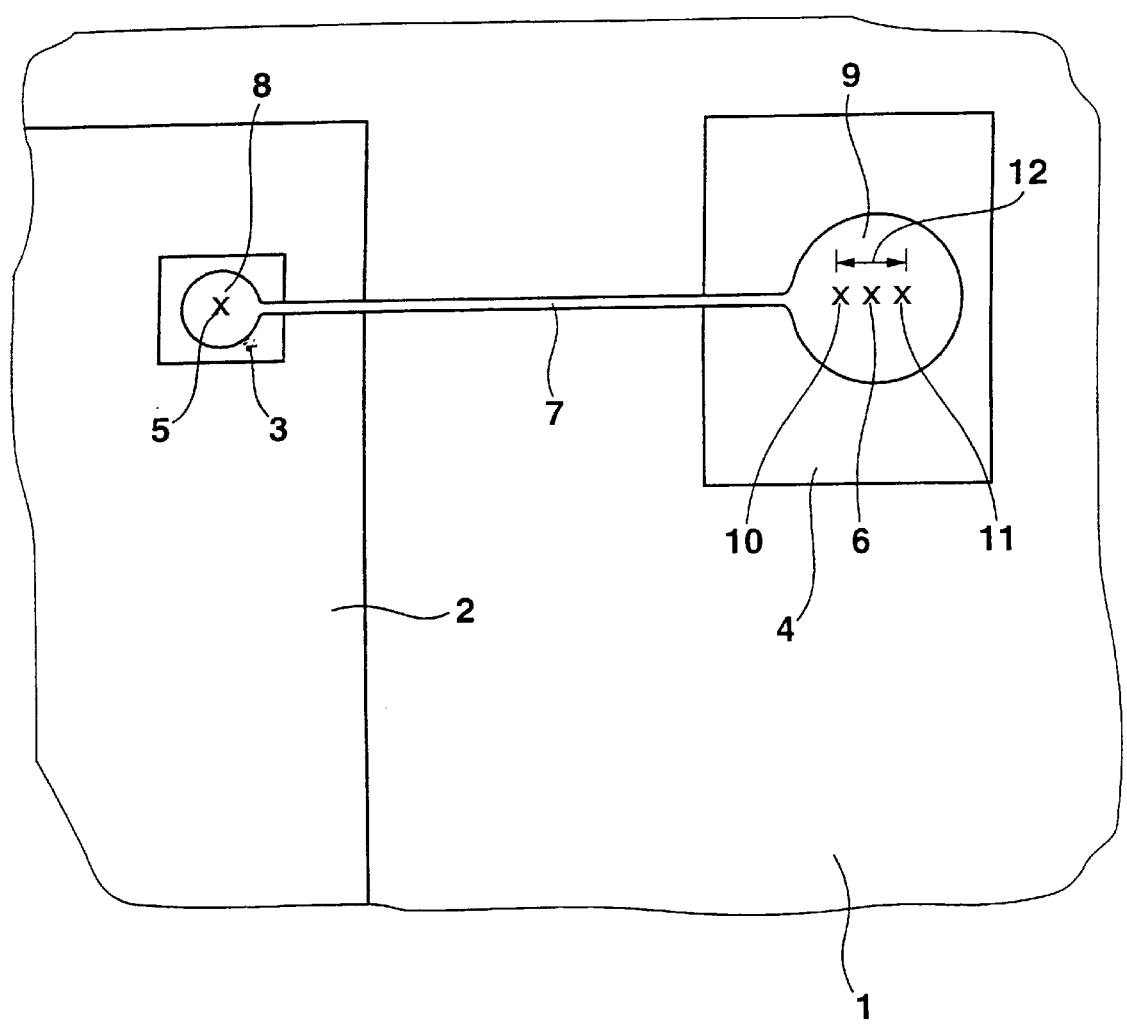
FIG. 1 shows an arrangement of a wire connection according to the present invention.

FIG. 1 schematically shows a plan view of a portion of a surface of a component carrier 1, for example a circuit board. A component 2 is mounted on circuit board 1. Circuit board 1 has a contacting surface 4. Arranged between bonding pad 3 on component 2 and contacting surface 4 is a wire connection 7, the one end on bonding pad 3 being constituted by a ball connection 8, and the other end by a wedge connection 9 on contacting surface 4. Ball position 5 is constituted on bonding pad. Ball position 5 on bonding pad 3, and wedge position 6 on contacting surface 4, are marked with an X. In addition, on contacting surface 4 a first end position 10 and a second end position 11 of a retaining bond are marked with an X. The spacing between the first and second end positions 10 and 11 is defined by a spacing value 12. (The X's in FIG. 1 are merely notional markings and not real features.)

Wire connection 7 is a usual ball-and-wedge connection between a component and a component carrier. A retaining bond can additionally be provided on the wedge connection. In FIG. 1, the ball and wedge positions 10 and 11 of such a retaining bond are drawn on wedge connection 9; the retaining bond itself is not illustrated in the schematic depiction. Positions 10 and 11 that are drawn in are the end positions of a retaining bond such as is evident from the German Patent Application No. 198 23 623.9.

Figure 2:
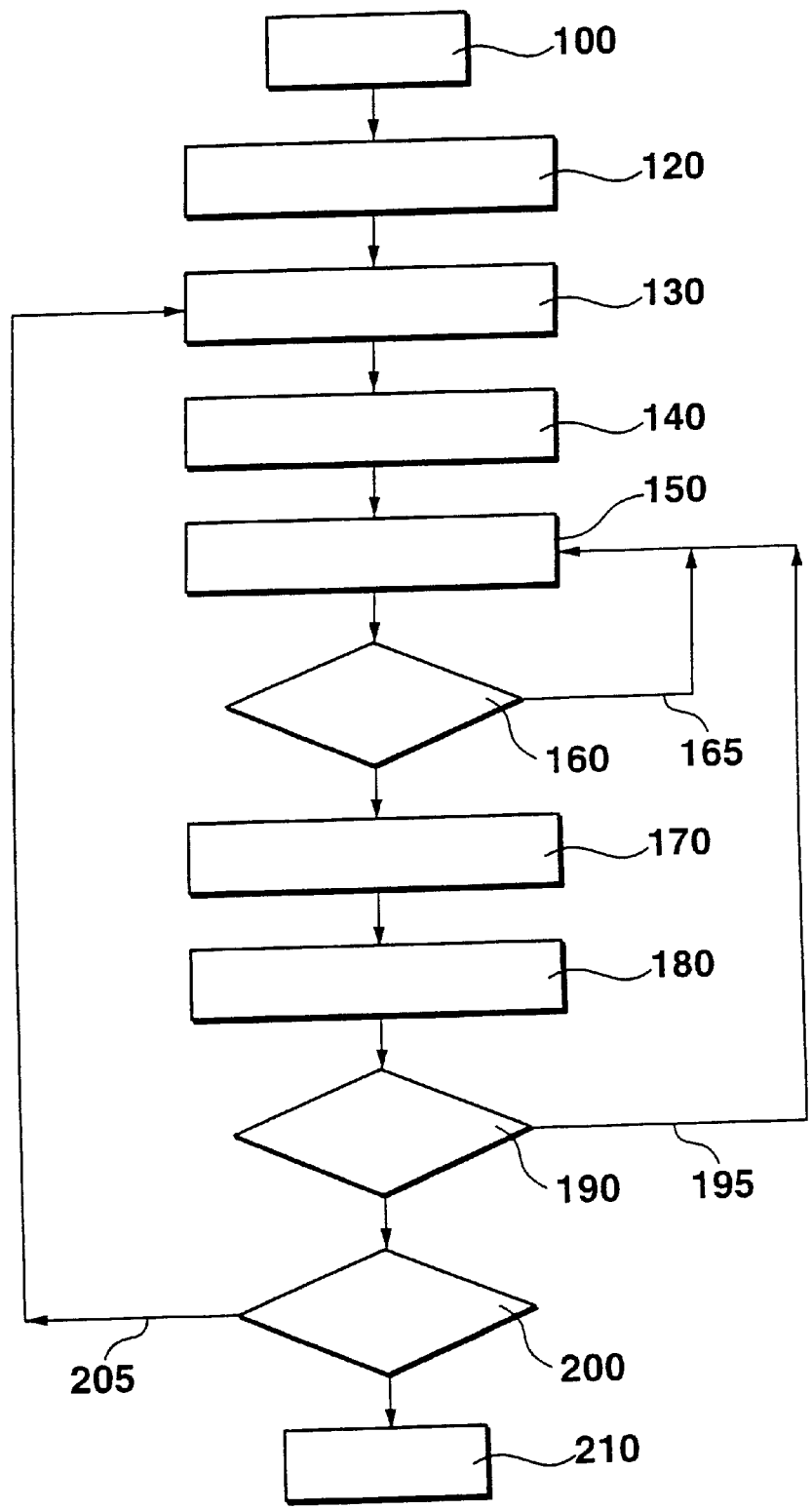
FIG. 2 shows a flow chart representing a method for producing wire connections according to the present invention.

FIG. 2 shows a flow chart for a method according to the present invention for producing wire connections. Following a start 100, first of all a parameter input 120 occurs. This is followed by a pattern recognition operation 130; in a further step, a calculation 140 of current coordinates is performed. Production 150 of a wire connection is then accomplished. A query 160 queries whether a spacing value has been provided for the wire connection that was produced. If not (165), the next wire connection is produced. Otherwise a further calculation 170 is made of the coordinates of the retaining bond assigned to the wire connection. Lastly, there is an assignment 180 of the retaining bond. A further query 190 asks whether further wire connections are provided. If so (195), execution transitions to production of the next wire connection. Otherwise a further query 200 asks whether further component carriers are to be processed. If so (205), execution returns to pattern recognition 130. Otherwise the program is terminated (210).

At input 120, first the ball and wedge positions of the wire connections that are to be produced are stored (input 120). Optionally, spacing values that characterize a retaining bond assigned to a wire connection are assigned to the pairs of ball and wedge positions; the spacing value indicates the spacing between the ball and wedge positions of the retaining bond. In addition, production parameters can be assigned to each pair of ball and wedge positions and to the spacing values. These production parameters are, for example, the ball size, the force for application of the ball onto the component or the force for production of the wedge connection, the time period during which the force acts, the temperature, the ultrasonic output, etc. The production parameters of the wire connection and of the assigned retaining bond can differ from one another; in particular, the ball for the retaining bond can be made larger than for the wire connection, in which the ball, because of the small bonding pad 3 on the component, must be made relatively small. This input step 120 is superfluous if the values have already been entered into the computer before the program is started. A component carrier introduced into the bonding apparatus, on which components are already located, is subjected to a pattern recognition operation 130. This pattern recognition operation determines the actual positions of the components and the component carrier, and their positions relative to one another. In a further step 140, a calculation is made of the current coordinates of the ball and wedge positions of the wire connections, on the basis of the pattern recognition operation and the ball and wedge positions entered in step 120. This is followed by production 150 of a first wire connection between a component and a contacting surface 4 on the component carrier. If no spacing value for the wire connection has been assigned (query 160), execution then transitions via path 165 to production 150 of the next wire connection. Otherwise, in a further calculation 170, the ball and wedge positions of the defined retaining bond are calculated from the current coordinates of the ball and wedge positions of the already produced wire connection and the assigned spacing value. Calculation of the coordinates of the ball and wedge positions of the retaining bond 2 as a function of the current coordinates of the ball and wedge positions of the wire connection guarantees exact alignment, on the three-dimensional arrangement of the previously produced wire connection, of the retaining bond that is to be produced. The spacing value indicates, in this context, the spacing between the ball and wedge positions of the retaining bond. The ball and wedge positions of the retaining bond are selected so that their connecting line lies on the connecting line between the ball and wedge positions of the wire connection. The wedge position of the wire connection lies, for example, centrally between the ball position and wedge position of the retaining bond. Lastly, after calculation 170, the retaining bond is applied by the bonding apparatus (step 180). If further wire connections are provided for (query 190), execution then transitions via path 195 to production of the next wire connection (step 150). Otherwise a check is made as to whether a further board is to be processed (query 200). If so (path 205), the pattern recognition operation 130 is once again activated, and the program proceeds in a manner corresponding to that for the first board. Otherwise the program is terminated (step 210).

When production parameters are entered in step 120, a variable set of production parameters can be assigned to each pair of end positions of a wire connection. Pairs of end positions can also be combined into groups to which, together, an identical set of production parameters is assigned. When the production method is started again (100), this simplifies the selection of production parameters and wire connections for a current manufacturing lot being bonded, if the positions of the wire connections have essentially already been entered. It is then easy, in a menu of the control program of the bonding apparatus, to modify the parameter set for the entire group of wire connections that are to be provided. In addition, the pairs of ball and wedge positions for wire connections that are to be provided can be continuously numbered, so that each number corresponds to a wire connection that is to be provided, and the highest number corresponds to the total number of wire connections that are to be provided. Retaining bonds can be provided for the wire connections (comprising ball, loop, and wedge); each retaining bond is assigned by way of the assignment of a spacing value to the relevant wire connection. It is thus possible to provide in the control program a menu with which spacing values entered for retaining bonds selectably are or are not taken into account. This too can occur both for individual wire connections and for groups of wire connections, so that a selection can be made, easily and without re-entering all the coordinates of the wire connections, as to whether and to what extent retaining bonds are to be provided for the respective batch.

In the exemplary embodiment shown in FIG. 2, calculation of the ball and wedge positions of the retaining bonds is performed immediately after respective production of the relevant wire connection. Alternatively, with a sufficiently large computer memory, calculation of the ball and wedge positions of all the retaining bonds can also be performed before bonding begins, immediately after pattern recognition and together with calculation of the current coordinates of the ball and wedge positions of the wire connections. As an alternative to the exemplary embodiment shown in FIG. 2, provision can also be made first to produce all the wire connections, and then, in a further step, to arrange all the retaining bonds.

The calculation instruction for the ball and wedge positions of the retaining bonds as a function of the ball and wedge positions of the wire connection and the assigned spacing value is obtained, for example, from a parameter, to be entered in further step 120, that defines whether what is involved is a usual retaining bond having a loop, i.e. one configured like an independent wire connection, or a special embodiment of a retaining bond such as the one described in the German Patent Application No. 198 23 623.9. In the latter case, the calculation instruction simply reads, for example: "Connect notional ball and wedge positions of the wire connection with a straight line, notionally extend the straight line beyond the wedge position, and define the ball and wedge positions of the retaining bond on the straight line in such a way that they are equally spaced from the wedge position of the wire connection and the spacing between the ball position and the wedge position of the retaining bond corresponds exactly to the spacing value that was entered." Other ways of calculating the ball and wedge positions of the retaining bond can be provided for and lie within the context of the present invention, for example providing for an angle between the notional connecting line between the ball and wedge positions of the wire connection and the notional connecting line between the wall and wedge positions of the retaining bond. In addition, the configuration of a wire connection between the ball and wedge positions of the retaining bond using the method described also lies, of course, within the context of the present invention. Also contained within the idea of the present invention is the provision of multiple retaining bonds for a wire connection, in order to influence or further improve the mechanical and/or electrical properties of the wire connection. In all cases it is essential to take into account the relative position of bonding pad 3 on the component relative to contacting surface 4 on the component carrier.

What is claimed is:

1. A method for producing at least one wire connection between at least one electrical component and a component carrier including a plurality of contacting surfaces, comprising the steps of:

defining at least one end position of the at least one wire connection on the at least one electrical component;

defining at least another end position of the at least one wire connection on the plurality of contact surfaces, the at least one end position and the at least another end position corresponding to end positions of the at least one wire connection;

ascertaining an instantaneous position of the at least one electrical component;

ascertaining an instantaneous position of the plurality of contacting surfaces;

calculating from the instantaneous position of the at least one electrical component and from the instantaneous position of the plurality of contacting surfaces a position pair corresponding to a ball position and a wedge position;

producing the at least one wire connection and equipping the at least one wire connection with a retaining bond having the ball position and the wedge position;

assigning at least one selectable spacing value to the end positions of the at least one wire connection;

calculating the ball position and the wedge position of the retaining bond from the position pair and the at least one selectable spacing value; and arranging the retaining bond on the at least one wire connection in accordance with the calculated ball position and the calculated wedge position.

2. The method according to claim 1, further comprising the steps of:

assigning a set of production parameters varying from pair to pair to each pair of end positions of each one of the at least one wire connection; and producing each one of the least one wire connection in accordance with the set of production parameters.

3. The method according to claim 2, further comprising the steps of:

combining multiple pairs of end positions of at least some of the at least one wire connection into at least one group; and assigning the set of production parameters to the at least one group.

4. The method according to claim 2, further comprising the steps of:

defining the position pair as at least one position pair including the ball position and the wedge position for the at least one wire connection;

assigning the set of production parameters each one of the least one position pair;

assigning the at least one selectable spacing value to the at least one position pair;

assigning retaining bond production parameters to each one of the at least one selectable spacing value;

detecting the position of the at least one electrical component;

detecting the position of the plurality of contacting surfaces;

calculating a current coordinate of the ball position and a current coordinate of the wedge position, the current coordinate of the ball position and the current coordinate of the wedge position corresponding to current coordinates of the ball position and the wedge position;

calculating retaining bond coordinates for the ball position and the wedge position for defined retaining bonds from the current coordinates of the ball position and the wedge position of the at least one position pair to which the at least one selectable spacing value is assigned, and from the at least one selectable spacing value; and producing the at least one wire connection in accordance with the current coordinates, wherein the at least one wire connection is equipped with the retaining bond in accordance with the calculated retaining bond coordinates.

* * * * *